United States Patent
Cabanillas et al.

(10) Patent No.: US 11,156,652 B2
(45) Date of Patent: Oct. 26, 2021

(54) SYSTEM FOR DETECTING FAULTS IN A TRANSMISSION LINE BY USING A COMPLEX SIGNAL

(71) Applicant: COMMISSARIAT A L'ENERGIE ATOMIQUE ET AUX ENERGIES ALTERNATIVES, Paris (FR)

(72) Inventors: Esteban Cabanillas, Orsay (FR); Christophe Layer, Paris (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 281 days.

(21) Appl. No.: 16/467,973

(22) PCT Filed: Nov. 29, 2017

(86) PCT No.: PCT/EP2017/080767
§ 371 (c)(1),
(2) Date: Jun. 9, 2019

(87) PCT Pub. No.: WO2018/108526
PCT Pub. Date: Jun. 21, 2018

(65) Prior Publication Data
US 2020/0116777 A1     Apr. 16, 2020

(30) Foreign Application Priority Data
Dec. 12, 2016   (FR) ...................................... 1662308

(51) Int. Cl.
*G01R 31/11* (2006.01)
*G06F 17/15* (2006.01)
(Continued)

(52) U.S. Cl.
CPC .............. *G01R 31/11* (2013.01); *G01R 31/08* (2013.01); *G01R 31/086* (2013.01); *G06F 17/15* (2013.01); *G01R 31/2839* (2013.01); *G01R 31/58* (2020.01)

(58) Field of Classification Search
CPC .... G01R 31/11; G01R 31/086; G01R 31/083; G01R 31/2839; G01R 31/08; G01R 31/58; G06F 17/15; H04B 3/46
See application file for complete search history.

(56) References Cited

U.S. PATENT DOCUMENTS 4,630,228 A * 12/1986 Tarczy-Hornoch .......................... G01R 23/163
324/542

2011/0035168 A1   2/2011 Lelong et al.
(Continued)

FOREIGN PATENT DOCUMENTS

| FR | 3 012 617 A1 | 5/2015 |
| WO | 2014/144436 A1 | 9/2014 |
| WO | 2015/145068 A1 | 10/2015 |

OTHER PUBLICATIONS

Hassen, et al., "OMTDR using BER estimation for ambiguities cancellation in ramified networks diagnosis", 2013 IEEE Eighth International Conference on Intelligent Sensors, Sensor Networks and Information Processing, pp. 414-419, Apr. 2, 2013.
(Continued)

*Primary Examiner* — Amy He
(74) *Attorney, Agent, or Firm* — BakerHostetler

(57) ABSTRACT

A reflectometry system for the analysis of faults in a transmission line into which a complex signal, generated then modulated, has been injected, includes a means for measuring the modulated complex signal propagating in the transmission line, a demodulator of the measured signal designed to produce a demodulated complex signal, a com-
(Continued)

plex correlator configured for correlating the demodulated complex signal with a copy of the generated complex signal, in order to produce a first time-domain reflectogram corresponding to the real part of the complex correlation and a second time-domain reflectogram corresponding to the imaginary part of the complex correlation, a module for joint analysis of the first time-domain reflectogram and of the second time-domain reflectogram for identifying the presence of faults in the transmission line.

12 Claims, 7 Drawing Sheets

(51) Int. Cl.
    *G01R 31/08*     (2020.01)
    *G01R 31/28*     (2006.01)
    *G01R 31/58*     (2020.01)

(56)           References Cited

U.S. PATENT DOCUMENTS

2011/0307197 A1\*  12/2011  Lelong .................. G01R 31/11
                                                                 702/58
2016/0139194 A1    5/2016  Cohen et al.
2016/0266194 A1    9/2016  Hassen et al.

OTHER PUBLICATIONS

Jackson, et al., "Systolic FFT Architecture for Real Time FPGA Systems", MIT Lincoln Laboratory, Sep. 29, 2004.

\* cited by examiner

SYSTEM FOR DETECTING FAULTS IN A TRANSMISSION LINE BY USING A COMPLEX SIGNAL

CROSS-REFERENCE TO RELATED APPLICATIONS

This application is a National Stage of International patent application PCT/EP2017/080767, filed on Nov. 29, 2017, which claims priority to foreign French patent application No. FR 1662308, filed on Dec. 12, 2016, the disclosures of which are incorporated by reference in their entirety.

FIELD OF THE INVENTION

The invention relates to the field of the analysis of faults affecting transmission lines, such as electrical cables and, more particularly, communications cables.

More precisely, the invention relates to the particular field of reflectometry applied to the diagnostics of wired systems, which encompasses the field of the detection, the localization and the characterization of faults in simple transmission lines or complex wired networks.

BACKGROUND

The known reflectometry methods operate according to the following method. A controlled reference signal, for example a pulsed signal or potentially a multi-carrier signal, is injected into one end of the cable to be tested. More generally, the reference signal used is chosen according to its inter-correlation properties. The signal propagates along the cable and is reflected on the singularities that it comprises.

A singularity in a cable corresponds to a rupture of the conditions of propagation of the signal within this cable. It results, more often than not, from a fault which locally modifies the characteristic impedance of the cable by causing a discontinuity in its line-behavior parameters. A fault may result from any type of local degradation of a cable, from a pinching, from a rubbing/wearing or from a surface degradation of the sheath of the cable.

The reflected signal is retro-propagated back up to the point of injection, then is analyzed by the reflectometry system. The delay between the injected signal and the reflected signal allows a singularity, corresponding to an electrical fault, to be localized in the cable. A fault may result from a short-circuit, from an open circuit or else from a local degradation of the cable or even from a simple pinching of the cable.

Reflectometry is based on the principle of a measurement of an echo of the injected signal on a singularity of the cable being analyzed. However, there are regions of the cable, known as blind spots, for which an echo will not be measurable. These regions depend on the wavelength of the signal, hence on its frequency, on the speed of propagation of the signal, on the sampling frequency of the measured signal and on the distance between the point of injection of the signal and the point where the singularity is situated. If a fault appears in a blind spot, it is not therefore possible to detect its presence using a conventional reflectometry method.

Furthermore, the detection of faults with precision requires the use of a high-frequency signal in order for the wavelength of the injected signal to correspond to the physical dimensions of the faults in the cable. However, the analog-digital converters which allow a high-frequency signal to be injected and to be measured are costly. Furthermore, the transmission channels corresponding to the various technologies of cables targeted by the applications of reflectometry are, more often than not, very selective in frequency and do not therefore allow a wideband observation and diagnostic process. Certain frequency bands may be substantially attenuated or subject to interference, which can render the signal measured by the reflectometry system unusable or, at the very least, make the identification of the potential faults complex.

Another problem also relates to the compatibility of a reflectometry system with a cable or a wired communications network. For such cables, the reflectometry signal may interfere with the communications signals also transmitted via these cables, which makes a diagnostic test impossible when the communications network is in operation. Certain frequency bands cannot be used for the reflectometry diagnostic because they are reserved for the transmission of data.

The reflectometry methods and systems for measuring the state of health of a cable and characterizing the presence of potential faults have been the subject of numerous publications.

Although not exhaustive, the international patent applications WO2014/144436 and WO2015/145068 may be mentioned, which describe frequency-domain reflectometry systems respectively based on spectral spreading signals and orthogonal multi-carrier (OFDM) signals.

These systems do not solve the aforementioned problems because they operate more often than not at a fixed frequency, do not allow faults present in a blind spot to be identified nor the reflectometry system to be operated over a wired communications network in operation without interfering with the communications.

SUMMARY OF THE INVENTION

The invention allows the problem of the blind spots to be solved by using a quadrature-modulated complex reflectometry signal and by exploiting in a combined manner the reflectograms obtained for the real channel and the imaginary channel of the measured signal.

The invention also allows a wideband frequency analysis of a cable to be carried out by the use of a frequency transposition of the signal injected into the cable.

The use of a complex signal also allows a simultaneous operation of data communications via the cable to be analyzed and of an analysis of the faults in the cable by reflectometry with twice the data transmission rate with respect to a real signal.

The subject of the invention is thus a reflectometry system for the analysis of faults in a transmission line in which a complex signal, generated then modulated, has been injected, said system comprising:
- a means for measuring the modulated complex signal propagating in the transmission line,
- a demodulator of the measured signal able to produce a demodulated complex signal,
- a complex correlator configured for correlating the demodulated complex signal with a copy of the generated complex signal, in order to produce a first time-domain reflectogram corresponding to the real part of the complex correlation and a second time-domain reflectogram corresponding to the imaginary part of the complex correlation,
- a joint analysis module for the first time-domain reflectogram and for the second time-domain reflectogram in order to identify the presence of faults in the transmission line.

According to one particular aspect of the invention, the analysis module is configured for determining a single time-domain reflectogram based on the complex correlation module.

According to one variant embodiment, the system according to the invention furthermore comprises a phase detector configured for measuring the phase of the complex correlation at the 0 of the time abscissa and a phase corrector configured for correcting the demodulated complex signal of the phase measured by the phase detector.

According to one variant embodiment, the system according to the invention furthermore comprises a complex signal generator, a modulator designed to modulate the complex signal for producing a modulated signal and a means for injecting the modulated signal at one point of the transmission line.

According to one variant embodiment, the system according to the invention furthermore comprises:
- a local oscillator designed to control the frequency of the modulator for performing a frequency transposition of the signal and a local oscillator designed to control the frequency of the demodulator for performing a transposition of the signal into baseband,
- a control mechanism designed to control the value of the frequency at which the signal is transposed.

According to one particular aspect of the invention, the control mechanism is configured for determining the value of the transposition frequency of the signal as a function of at least one analysis of the first time-domain reflectogram and/or of the second time-domain reflectogram.

According to one particular aspect of the invention, the analysis of the first time-domain reflectogram and/or of the second time-domain reflectogram relates to a measurement of the attenuation of the measured signal.

According to one particular aspect of the invention, the generated complex signal is a multi-carrier frequency-domain signal, said system furthermore comprising, for this purpose, an inverse Fourier transform module applied to the generated complex signal and a Fourier transform module applied to the demodulated complex signal.

According to one particular aspect of the invention, the complex correlator comprises a correlator of the frequency-domain signal generated with the frequency-domain signal demodulated and an inverse Fourier transform applied to the result of the correlation.

According to one particular aspect of the invention, the complex signal generator comprises an interface for receiving digital data to be transmitted and a modulator for converting the digital data into complex symbols, said system furthermore comprising a receiver for converting the complex demodulated signal into received digital data.

According to one variant embodiment, the system according to the invention furthermore comprises an encoder of the digital data to be transmitted and a decoder of the digital data received, the control mechanism being configured for determining the coding rate of the encoder and of the decoder.

According to one variant embodiment, the system according to the invention furthermore comprises a module for calculating the error rate between the decoded digital data and the digital data to be transmitted, the control mechanism being configured for determining the value of the frequency for transposition of the signal and/or the coding rate as a function of at least the calculated error rate.

BRIEF DESCRIPTION OF THE DRAWINGS

Other features and advantages of the present invention will become more clearly apparent upon reading the description that follows in relation with the appended drawings, that show.

DETAILED DESCRIPTION

Figure 1:
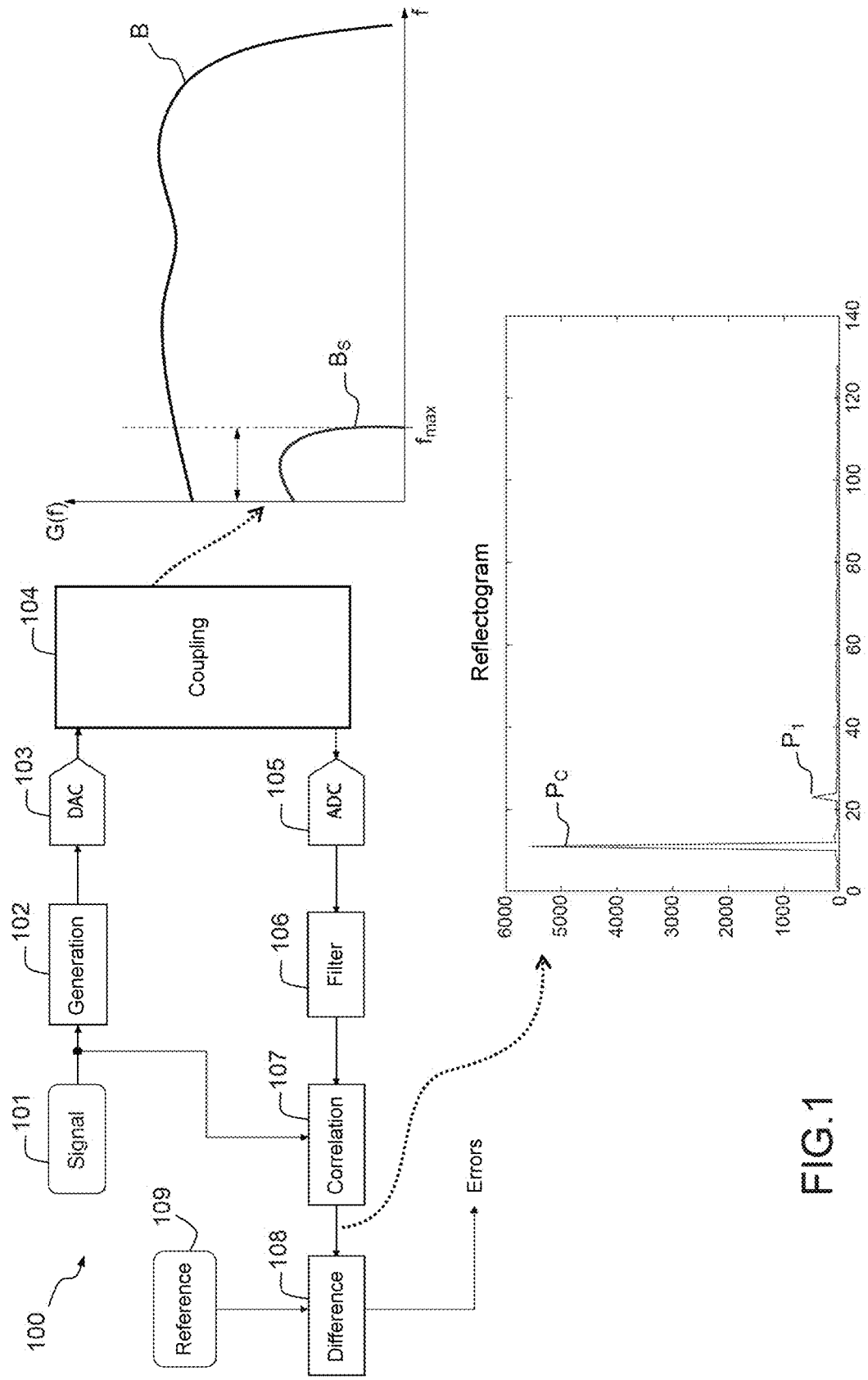
FIG. 1, a diagram of a system for detecting faults in a transmission line according to the prior art, FIG. 2, a diagram of a system for detecting faults in a transmission line according to the invention, FIG. 2*b*, two examples of reflectograms illustrating the advantage of the use of a complex reflectometry signal, FIG. 3, a diagram of a system for detecting faults using a signal of the OMTDR type, FIG. 4, a diagram of a system for detecting faults in a transmission line according to one particular embodiment of the invention, FIG. 5, the diagram from FIG. 4, in which the correlation module is detailed, FIG. 6, a diagram of a system for detecting faults according to one variant embodiment of the invention.

FIG. 1 shows a diagram of a system 100 for detecting faults in a transmission line, by reflectometry, according to a known principle of the prior art.

The system 100 principally comprises a generator 102 of a reference signal based on the parameters 101 of the signal. The reference signal may be in the time domain or in the frequency domain. It may be a simple time-domain pulse or a more sophisticated signal as long as the latter exhibits good auto-correlation properties, in other words the result of an auto-correlation calculation applied to this signal yields a significant peak in amplitude that it is possible to identify and to detect. For example, the signal used may be of the OMTDR (Orthogonal Multi-tone Time Domain Reflectometry) or MCTDR (Multi-Carrier Time Domain Reflectometry) type. A digital-analog converter 103 allows the digital signal to be converted into an analog signal which is subsequently injected into one point of the transmission line (not shown in FIG. 1) via a coupler 104.

The system 100 subsequently comprises a measurement part which comprises a coupler 104 (identical to the previous one or different) for measuring, at one point of the line, the reflected signal retro-propagated in the transmission line. The measured analog signal is digitally converted via an analog-digital converter 105. The digital signal may be filtered 106 or averaged in order to limit the influence of the measurement noise, then a correlator 107 is responsible for performing a correlation between the measured signal and the generated signal, for various time offsets, in order to produce a time-domain reflectogram. One example of a time-domain reflectogram is given in the lower part of FIG. 1. It comprises a certain number of amplitude peaks which correspond to discontinuities of impedance in the transmission line. The positions on the time axis of the peaks on the reflectogram correspond to positions in the transmission line. The conversion relationship between time abscissa t and position d is given by the equation d=V·t where V is the speed of propagation of the signal in the line. The reflectogram obtained can be corrected 108 by calculating its difference with respect to a reference reflectogram 109. On the reflectogram given as an example in FIG. 1, a first peak $P_0$ is observed corresponding to the impedance discontinuity at the point of injection of the signal, then a second peak $P_1$ which corresponds to another discontinuity in impedance which may come from an electrical fault on the line. Thus, by analyzing the reflectogram, the presence and the localization of faults in a transmission line may accordingly be deduced.

On the right-hand side of FIG. 1, one example of a frequency response B of a propagation channel associated with a transmission line, for example a communications cable, is shown. On the same diagram, the spectral occupation $B_s$ of a typical reflectometry signal is shown. This diagram illustrates the fact that, more often than not, the frequency band available in the cable is much wider than that of the injected signal, notably owing to the limitations of the digital-analog converter 103.

One aim of the invention is to provide a system that is more flexible with regard to the parameter control of the spectral occupation of the reflectometry signal injected in the cable to be analyzed. On the one hand, operating at high frequency allows smaller faults to be better characterized and, on the other hand, certain frequency bands may be affected by interference, attenuated owing to the selectivity in frequency of the frequency response of the cable or indeed reserved for other applications (for example for data communications).

Figure 2:
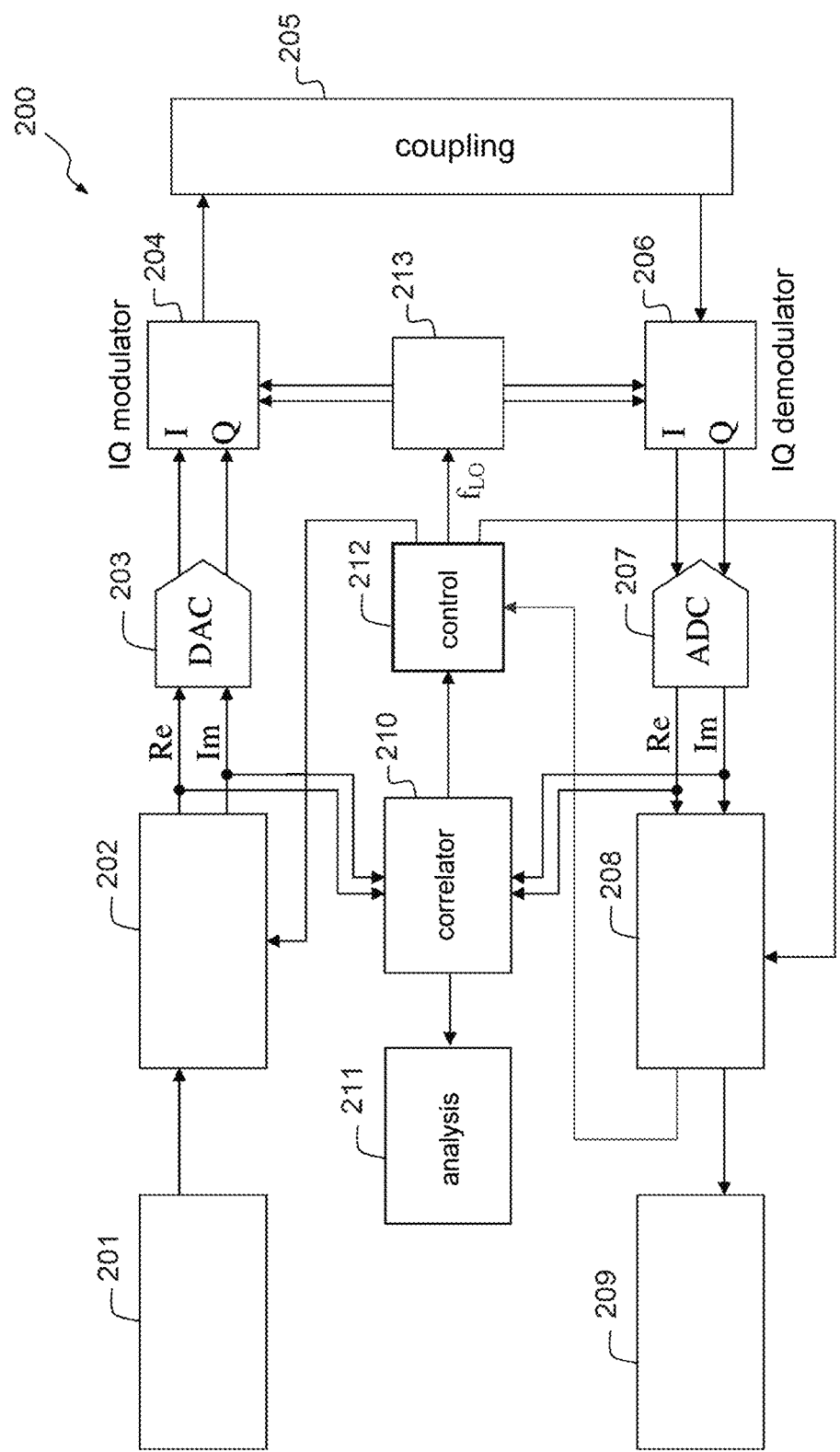

For this purpose, the system 200 whose diagram is shown in FIG. 2 is provided, according to the invention. One main difference between the system 200 according to the invention and a system 100 according to the prior art resides in the use of a complex reflectometry signal rather than a real signal as is usually the case. Thus, a complex signal is generated 201,202 and delivered to the input of a digital-analog converter 203 in the form of two parallel channels, one channel in phase I and one channel in phase quadrature Q. The converter 203 thus produces two analog signals which are supplied to an IQ modulator 204 which carries out a phase modulation so as to produce an analog signal modulated in phase. The modulated signal is injected into the transmission line by means of a coupler 205 or any other equivalent device.

A measurement of the signal retro-propagated in the transmission line is performed by capturing the signal via the same coupler 205, or a second coupler different from the first coupler 205, then is supplied to the input of an IQ demodulator 206 which carries out a phase demodulation of the signal so as to produce two analog signals respectively corresponding to an in-phase channel I and a channel in phase quadrature Q. The two signals are subsequently digitized via an analog-digital converter 207.

The system 200 also comprises a complex correlator 210 for carrying out a correlation, at different moments in time, between the complex signal measured at the output of the analog-digital converter 207 and the generated complex signal at the input of the digital-analog converter 203. Thus, the correlator 210 supplies two separate reflectograms: a first reflectogram corresponding to the real channel (I) of the complex signal and a second reflectogram corresponding to the imaginary channel (Q) of the complex signal. In other words, the first reflectogram corresponds to the real part of the complex correlation, whereas the second reflectogram corresponds to the imaginary part of the complex correlation. The two reflectograms are used by an analysis module 211 for detecting and characterizing the presence of potential faults.

The use of a complex signal associated with the use of two separate reflectograms allows the detection of faults to be improved notably while solving the problem of blind spots.

As previously explained, there exist regions, known as blind spots, corresponding to certain distance values between the point of injection of the signal and the fault, for which the echo of the signal on the fault is not detected. This problem is well known in the field of reflectometry and depends on various parameters including the length of the cable, the wavelength of the signal, its sampling frequency and the speed of propagation of the wave in the cable.

Thus, the usual reflectometry systems, such as that described in FIG. 1, which only use a real signal, do not allow the presence of a fault to be detected if it is situated in a blind spot.

When a complex signal is used, such as is provided by the system in FIG. 2, the blind spots for the real part of the signal are not situated at the same distances as the blind spots for the imaginary part of the signal. More precisely, the blind spots relating to the real part of the signal correspond to regions where the imaginary part of the signal is maximized. Thus, by jointly exploiting a first reflectogram corresponding to the real part of the signal and a second reflectogram corresponding to the imaginary part of the signal, the detection and the localization of faults are improved since it is then possible to characterize a fault irrespective of its position on the cable.

Figure 2B:
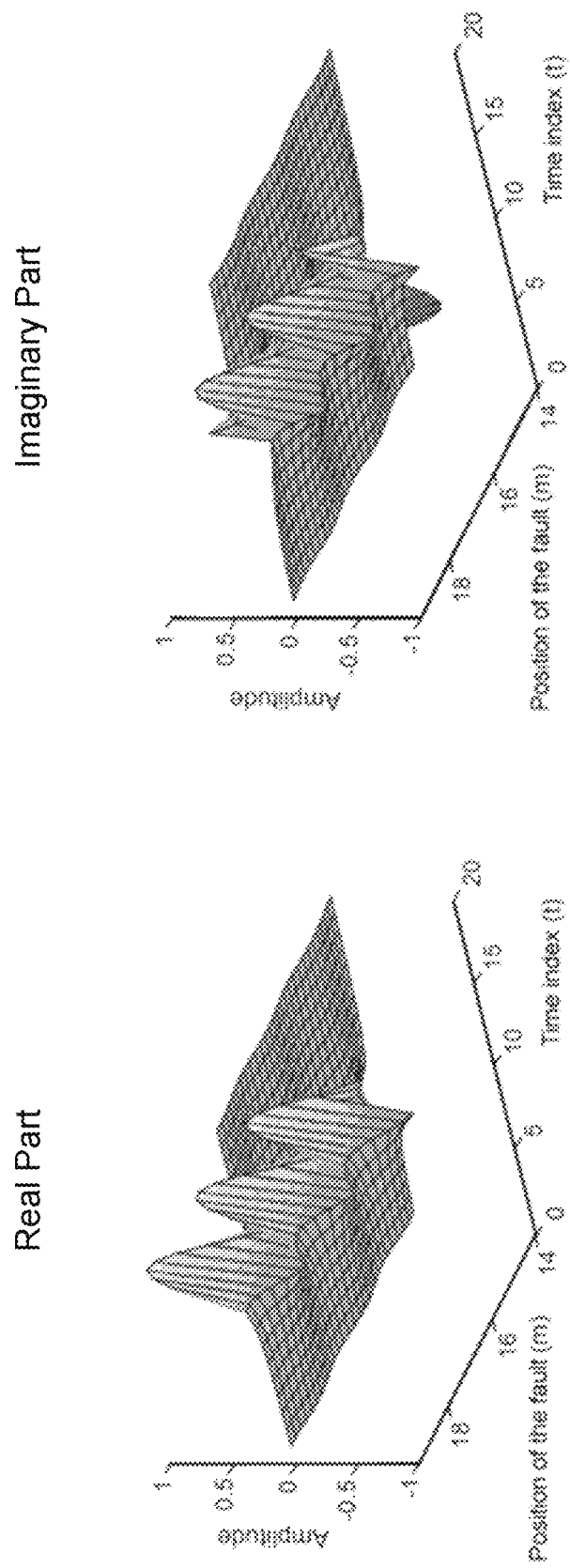

This principle is illustrated in FIG. 2b, which shows two examples of reflectograms respectively corresponding to the real part of the complex correlation 210 (on the left of the figure) and to its imaginary part (on the right of the figure). The diagrams in FIG. 2b illustrate the results obtained by making the position of a fault along a cable vary. Each diagram shows the amplitude of the reflectogram as a function, on the one hand, of the time abscissa and, on the other, of the position of the fault with respect to the point of injection (expressed in meters). The amplitude peak observed in a reflectogram gives the corresponding position of the detected fault. This position is obtained by converting the time abscissa of the peak into the domain of distances (via the speed of propagation of the signal).

On each of the two reflectograms, it may be observed that, for certain values of the distance between the fault and the point of injection of the signal, no amplitude peak is observed in the reflectogram. This phenomenon periodically re-occurs when the position of the fault along the cable is varied. The regions for which no peak is observed in the reflectogram correspond to the regions referred to as blind spots.

However, it may also be noted that the blind spots are not situated at the same positions for the reflectogram corresponding to the real part of the signal and for the reflectogram corresponding to the imaginary part of the signal.

Thus, by combined use of the two reflectograms, there is no position of a fault for which it is not possible to identify a peak of amplitude in at least one of the two reflectograms.

The analysis 211 of the two reflectograms may consist in observing the two reflectograms separately, for example by fixing a detection threshold for each reflectogram and by selecting the peaks in amplitude observed that exceed this threshold, in one or the other of the two reflectograms.

The analysis 211 may also consist in calculating a single reflectogram based on the two reflectograms supplied by the correlator 210, for example by calculating the complex correlation modulus or the square of the complex correlation module. Thus, an amplitude peak corresponding to a fault will be present in the complex correlation modulus irrespective of the position of the fault.

The diagram in FIG. 2 shows a single system 200 which comprises both the elements dedicated to the generation and to the injection of the signal into the cable and the elements dedicated to the measurement of the reflected signal, to the calculation and to the analysis of the reflectogram.

In one variant embodiment not shown in FIG. 2, the system 200 may be decomposed into two separate systems, a first system dedicated to the generation and to the injection of the signal at any given point of the cable (for example at one end) and a second system dedicated to the measurement of the reflected signal at any given point of the cable, to the calculation and to the analysis of the reflectogram. This variant embodiment is notably advantageous when the point of injection of the signal and the point of measurement of the reflected signal are two separate points, for example when the cable is of very long length or for complex networks of cables.

The analysis module 211 may output or display the results of analysis to a user via a man-machine interface (not shown), for example a screen or any other interface. The results of analysis may consist in supplying the calculated reflectogram(s) or in directly supplying the position(s) of the fault(s) identified together with any other information relating to the detected faults.

According to one particular embodiment of the invention, the system 200 also comprises a control mechanism 212 coupled to a local oscillator 213 which acts on the modulator 204 in order to carry out a transposition of the signal into frequency prior to its injection into the cable. Reciprocally, the local oscillator 213 also acts on the demodulator 206 in order to bring the signal back into baseband after its acquisition. Although only one local oscillator 213 has been shown in FIG. 2, there may be two separate local oscillators respectively associated with the IQ modulator 204 and with the IQ demodulator 206.

The control mechanism 212 controls the local oscillator by communicating to it the value of the transposition frequency of the signal.

One advantage of this embodiment of the invention is that it allows the signal to be transposed into the high frequencies of the propagation channel associated with the cable to be analyzed. A high-frequency signal has a short wavelength which allows the smaller faults to be better characterized. Furthermore, the control mechanism 212 can determine the transposition frequency as a function of various parameters.

The transposition frequency may be selected so as to place the signal within a frequency band authorized for the analysis of faults and to avoid any frequency band that is forbidden as it is reserved for other applications.

The transposition frequency may also be selected so as to choose the frequency band of the signal as a function of parameters of the cable to be analyzed. Indeed, the frequency band of a cable is generally very selective in frequency and the choice of the frequency of the signal has a direct impact on the measured reflectogram and hence on the precision of the characterization of the faults. It is therefore important to be able to optimize the frequency band of the signal and to be able to vary it dynamically according to the type of cable being analyzed.

The control mechanism 212 may also determine the transposition frequency according to an analysis of the reflectogram supplied by the correlator 210. More precisely, the control mechanism 212 can analyze the level of attenuation of the signal on the reflectogram and deduce from this information on the power level of the signal measured in the current frequency band. If the power level is too low, this means that the frequency band selected is too attenuated, and in this case the control mechanism 212 can select another frequency band and hence a new transposition frequency.

Other analysis criteria may be used based on the reflectogram in order, for example, to determine whether the frequency band of the signal is affected by interference or whether, more generally, the reflectogram is not usable and requires a change of frequency band. Thus, the control mechanism can dynamically modify the transposition frequency if the current frequency band of the signal is affected by interference.

The system 200 comprising the control mechanism 212 may also be used to perform a wideband reconstruction by performing successive scans of the whole frequency band of the cable by sub-bands. In this way, several reflectograms associated with several frequency sub-bands may be determined and a global reflectogram associated with the total frequency band of the cable can eventually be obtained.

According to another embodiment of the invention, the system 200 may also comprise a part 201,202 for the transmission of data together with a part 208,209 for receiving data. The transmission of data takes place via the reflectometry signal, thus allowing a system 200 to be designed that operates both as a communications system and as a system for analysis of faults by reflectometry or by transferometry. One advantage of this embodiment is that it allows both systems to be made to operate simultaneously without them mutually interfering with one another.

The transmission part of the system comprises a generator of digital data 201 or, more generally, an interface for receiving digital data from a communications application. It furthermore comprises a digital modulator 202 designed to convert the binary data into complex symbols in order to supply a complex digital signal to the converter 203. The digital modulator 202 may be a PSK (Phase Shift Keying) phase modulator or a QAM (Quadrature Amplitude Modulation) amplitude modulator or any other symbol modulator or coder capable of converting a sequence of bits into complex digital symbols belonging to a constellation of data symbols.

Optionally, the digital modulator 202 may also comprise a channel coder or corrector coder or digital data encoder which aims to add redundancy to the bits to be transmitted in order to protect them against potential interference causing transmission errors in the propagation channel.

The receiver part of the system comprises a digital demodulator 208 which carries out the conversion of the complex symbols of the measured signal into bits together with a data receiver 209 which transmits the demodulated bits to the destination application for the data. Optionally, the digital demodulator 208 comprises a decoder for decoding the demodulated bits if they have been coded at transmission. The digital demodulator 208 may also comprise a module for calculating the error rate on the symbols or on the bits received by comparison with the symbols or the bits transmitted or by a mechanism integrated into the decoder.

The control mechanism 212 may be configured for selecting the type of digital modulation/demodulation and/or the type of coding/decoding of the bits. In particular, the control mechanism 212 may determine the best coding rate to be applied to the bits to be transmitted according to the analysis of the reflectogram which gives an indication on the state of the transmission channel.

The control mechanism 212 may also use the error rate information calculated by the decoder in order to determine the parameters of the coder and of the decoder, but also for selecting the transposition frequency. This is because the error rate yields information on the level of interference within a given frequency band. Thus, if the error rate is too high, for example higher than a given threshold, the control mechanism may decide to select another frequency band for the signal.

The system 200 according to this embodiment designed for communications can allow several simultaneous communications over various frequency bands, by choosing a different transposition frequency for each system in the case of a wired communications network comprising several communications systems 200 connected to various points of the network. This configuration corresponds to a transferometry application.

One particular exemplary embodiment of the system according to the invention is now described associated with a reflectometry and multi-carrier frequency-domain communications signal of the OFDM (Orthogonal Frequency Division Multiplexing) type. This technology has notably been used as a basis for the generation of particular signals used in reflectometry of the OMTDR (Orthogonal Multi-tone Time Domain Reflectometry) or MCTDR (Multi-Carrier Time Domain Reflectometry) type.

Figure 3:
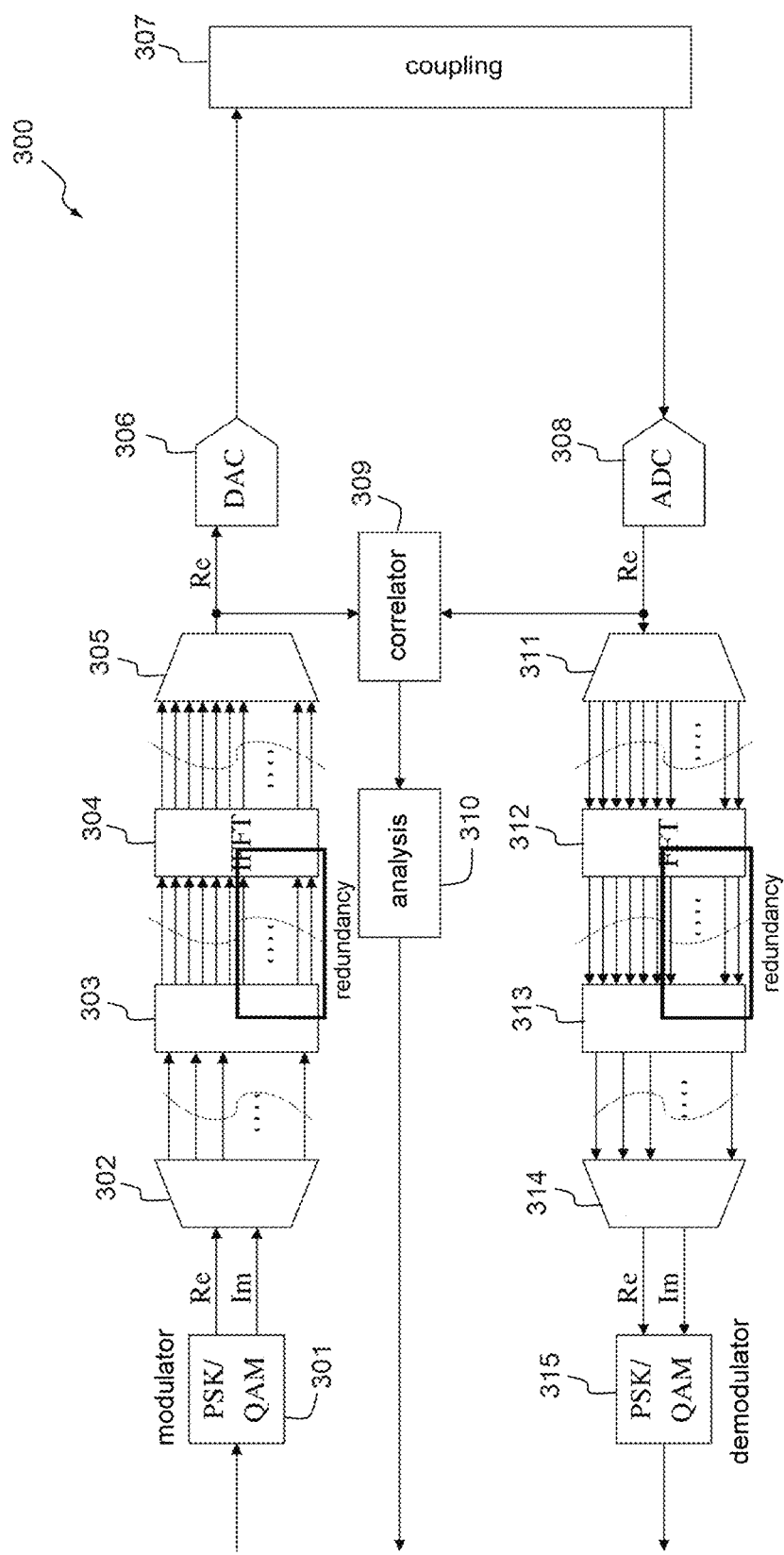

FIG. 3 shows a diagram of a reflectometry system and a data transmission system based on a signal of the OMTDR type.

The system described in FIG. 3 comprises a digital modulator 301, or a symbol coder, for converting a sequence of binary data to be transmitted into complex digital symbols via a PSK phase modulation or a QAM amplitude modulation. The complex digital signal thus formed is transmitted to a serial-parallel multiplexer 302 then to a pre-processing module 303 which performs a Hermitian symmetry of the symbols and adds a guard time. The symbols are subsequently transmitted to an inverse Fourier transform module 304. At the output of this module, the symbols are purely real owing to the pre-processing operation 303 carried out prior to the inverse Fourier transform 304. A demultiplexer 305 subsequently allows the real digital signal, which is sent to a digital-analog converter 306 then to a coupler 307, to be serialized in order to be injected into a transmission line.

The system also comprises a coupler 307 for measuring the reflected signal at one point of the line. The measured signal is subjected to the inverse operations of those carried out upon transmission. It is digitized via an analog-digital converter 308 then multiplexed via a multiplexer 311. A direct Fourier transform module 312 converts the signal into the frequency domain, then a post-processing operation 313, the inverse of the pre-processing operation 303 of carried out upon transmission, is applied. A demultiplexer 314 makes it possible to serialize the complex digital signal which is subsequently demodulated via a digital demodulator 315 or a symbol decoder.

The analysis of faults is carried out on a real signal by carrying out a correlation 309 between the signal at the input of the digital-analog converter 306 and the signal at the output of the analog-digital converter 308. An analysis module 310 allows the potential faults to be characterized using the measured reflectogram.

Figure 4:
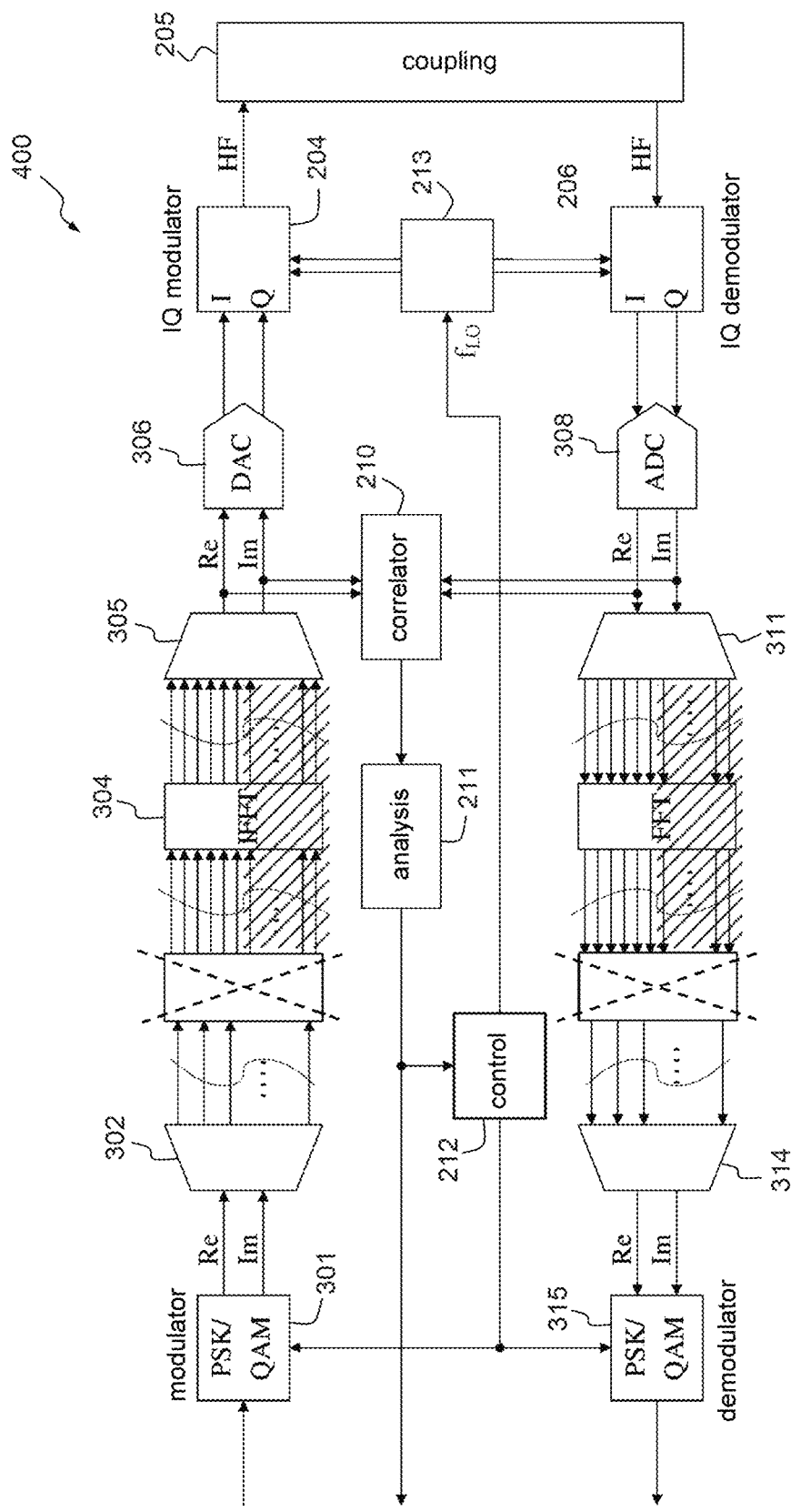

FIG. 4 shows an upgrade of the system in FIG. 3 to which the principles of the invention described in FIG. 2 have been applied.

The common elements between the system 400 in FIG. 4 and the system 300 in FIG. 3 are identified with the same numerical reference. Similarly, the common elements between the system 400 in FIG. 4 and the system 200 in FIG. 2 are also identified with the same numerical reference.

The invention applied to the system in FIG. 3 thus consists in directly exploiting a complex signal at the output of the inverse Fourier transform module 304 instead of a real signal as is the case for FIG. 3. Accordingly, the pre-processing 303 and post-processing 313, used with a view to rendering the signal real at the output of the IFFT module 304, are eliminated. In this way, the redundancy symbols inserted at the input of the module 304 may be eliminated. The complex correlation 210 is carried out between the signal at the input of the converter 306 and the signal at the output of the converter 308. In order to optimize the complexity of implementation, in particular the number of operations needed, the correlation 210 is performed by calculating the inverse Fourier transform of the product of the direct Fourier transforms of each of the two signals x and x'. This calculation can be illustrated by the following formula:

$$c(t)=\int_{-\infty}^{\infty}x'(t+\tau)\cdot x^*(\tau)d\tau=TF^{-1}\{TF\{x'(t)\}\cdot TF\{x^*(t)\}\}$$

Figure 5:
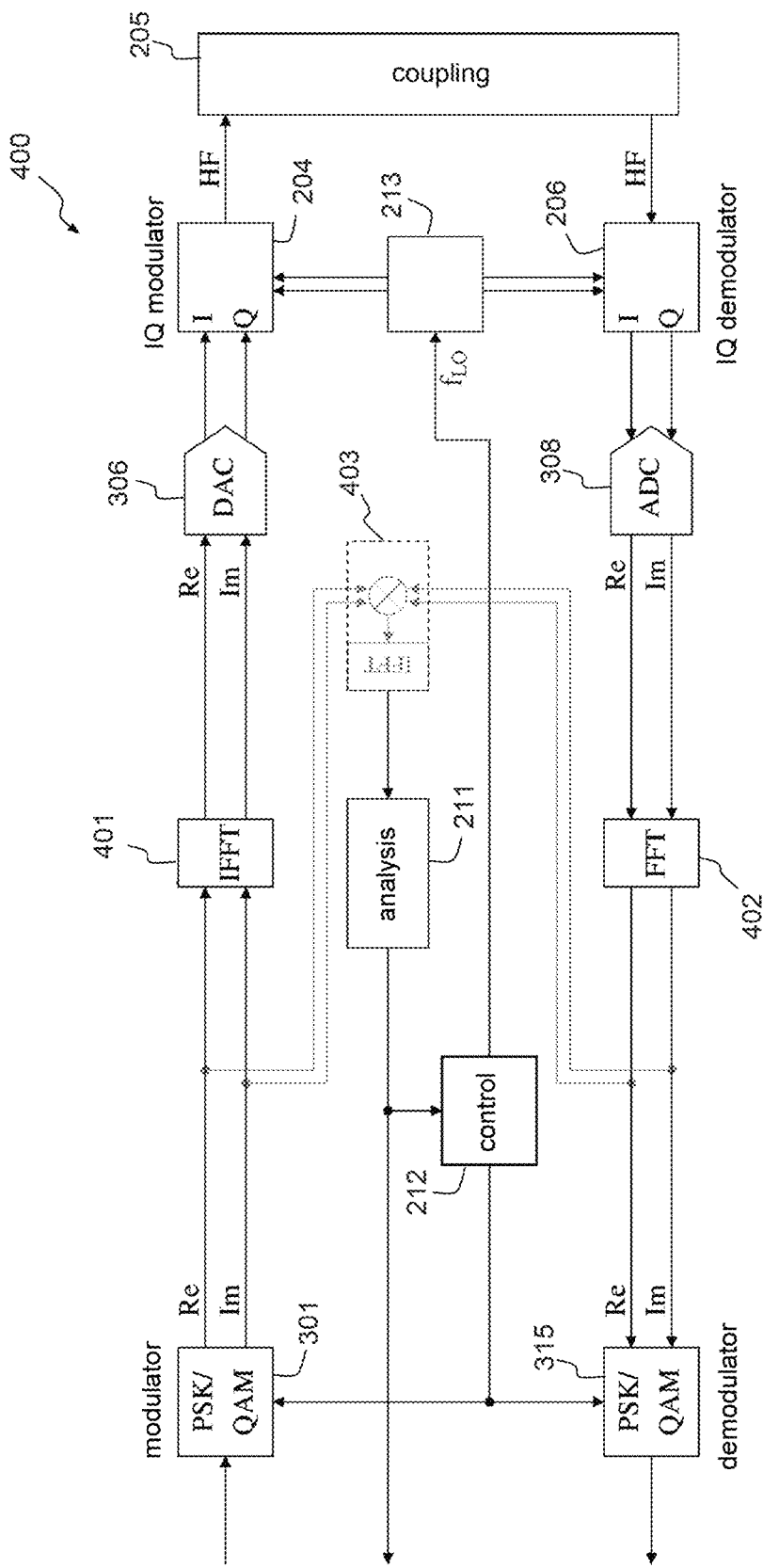

FIG. 5 shows one variant embodiment of the system described in FIG. 4. In this variant, a systolic implementation of the inverse 401 and direct 402 Fourier transform is used so that it is possible to eliminate the multiplexers and demultiplexers 302,305,311,314.

Furthermore, the correlator 403 may be simplified by directly carrying out the inverse Fourier transform of the product of the signals sampled at the input of the IFFT module 401 and at the output of the FFT module 402.

Figure 6:
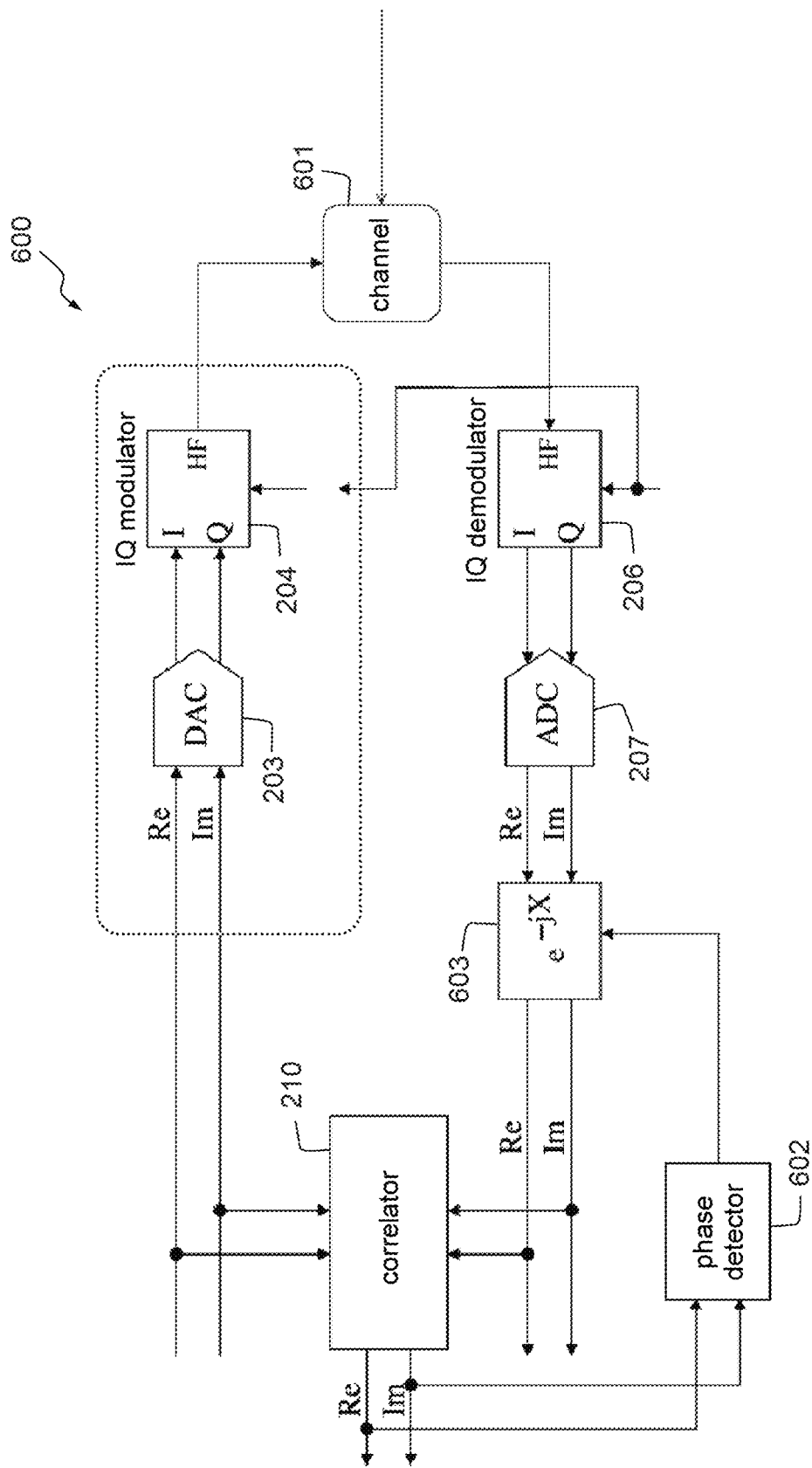

FIG. 6 shows another diagram of a system for detecting faults according to another variant embodiment of the invention.

According to this variant, the system 200 described in FIG. 2 is completed with a phase detector 602 and a phase corrector 603 whose purpose is to correct the phase errors to which the signal may be subject when it propagates in the cable and also to compensate for the phase shifts that may exist between the local oscillators associated with the IQ modulator 204 and with the IQ demodulator 206. Similarly, if the transposition frequency is modified during operation, the phase of the signal may be modified when received. A phase-shift can also appear between the signal injected into the cable and the measured signal owing to the respective frequency translation operations on the injected signal and on the measured signal.

The reflectometry signal transmitted in baseband is denoted x(t). The signal at the output of the IQ modulator 204 implementing a frequency translation toward the frequency $f_0$ is denoted $x_{rf}(t)=\Re(x(t)e^{j2\pi f_0 t})$, where $\Re(\ )$ denotes the real part of a complex signal.

The signal $x_{rf}(t)$ is demodulated at the output of the IQ demodulator 206. If the phase error between the modulator 204 and the demodulator 206 is equal to $\varphi_0$, and, neglecting the attenuation of the channel between transmitter and receiver, the baseband signal received is defined as:

$$x'(t)=x(t)e^{j\varphi_0}(1+e^{-j(2\pi 2f_0 t)})$$

The $2f_0$ frequency component is filtered (filter not shown in FIG. 6 and may be incorporated into the demodulator 206).

The reflectogram is obtained from the correlation between the signal received x'(t) then filtered and the injected signal x(t), by calculating the complex correlation c(t):

$$c(t)=\int_{\tau=-\infty}^{\infty}x'(t+\tau)x^*(\tau)d\tau=e^{j\varphi_0}\int_{\tau=-\infty}^{\infty}x(t+\tau)x^*(\tau)d\tau$$

The phase error may thus be directly extracted from the value c(t=0) of the reflectogram since, for t=0, the result of the integral $\int_{\tau=-\infty}^{\infty}x(t+\tau)x^*(\tau)d\tau$ is real. Thus, $c(t=0)=e^{j\varphi_0}$.

Thus, the system 600 described in FIG. 6 comprises a phase detector 602 able to measure the value at t=0 of the reflectogram calculated at the output of the correlator 210. A phase corrector 603 is subsequently applied to the signal at the output of the analog-digital converter 207 prior to calculating a new reflectogram.

According to one variant, the phase detector 602 may incorporate a loop filter in order to smooth the potential variations in the phase error and to ensure a convergence of the system.

The phase corrector 603 may consist of a simple complex multiplier.

The corrected signal at the output of the phase corrector 603 may thus subsequently be correctly demodulated in order to recover the binary data transmitted via the signal.

The various components of the system according to the invention may be implemented by means of software and/or hardware technology. In particular, the invention may be implemented, entirely or partially, by means of an onboard processor or of a specific device. The processor may be a generic processor, a specific processor, an ASIC (acronym for "Application-Specific Integrated Circuit") or an FPGA (acronym for "Field-Programmable Gate Array"). The system according to the invention may use one or more dedicated electronic circuits or a circuit for general use. The technique of the invention may be implemented on a reprogrammable processing machine (a processor or a microcontroller for example) executing a program comprising a sequence of instructions, or on a dedicated computing machine (for example an assembly of logic gates such as an FPGA or an ASIC, or any other hardware module).

The invention claimed is:

1. A reflectometry system for the analysis of faults in a transmission line into which a complex signal, generated then modulated, has been injected, said system comprising:
   a measurement device for measuring the modulated complex signal propagating in the transmission line,
   a demodulator of the measured signal designed to produce a demodulated complex signal,
   a complex correlator configured for correlating the demodulated complex signal with a copy of the generated complex signal, in order to produce a first time-domain reflectogram corresponding to the real part of the complex correlation and a second time-domain reflectogram corresponding to the imaginary part of the complex correlation,
   a module for joint analysis of the first time-domain reflectogram and of the second time-domain reflectogram for identifying the presence of faults in the transmission line.

2. The reflectometry system of claim 1, in which the analysis module is configured for determining a single time-domain reflectogram from a complex correlation module.

3. The reflectometry system of claim 1, further comprising a phase detector configured for measuring the phase of the complex correlation at the 0 of the time abscissa and a phase corrector configured for correcting the demodulated complex signal of the phase measured by the phase detector.

4. The reflectometry system of claim 1, further comprising a complex signal generator, a modulator designed to modulate the complex signal for producing a modulated signal and an injecting device for injecting the modulated signal at one point of the transmission line.

5. The reflectometry system of claim 4, further comprising:
   a local oscillator designed to control the frequency of the modulator for performing a frequency transposition of the signal and a local oscillator designed to control the frequency of the demodulator for performing a transposition of the signal into baseband,
   a control mechanism designed to control the value of a transposition frequency at which the signal is transposed.

6. The reflectometry system of claim 5, in which the control mechanism is configured for determining the value of the transposition frequency of the signal as a function of at least one analysis of the first time-domain reflectogram and/or of the second time-domain reflectogram.

7. The reflectometry system of claim 6, in which the analysis of the first time-domain reflectogram and/or of the second time-domain reflectogram relates to a measurement of the attenuation of the measured signal.

8. The reflectometry system of claim 4, in which the generated complex signal is a multi-carrier frequency-domain signal, said system further comprising, for this purpose, an inverse Fourier transform module applied to the generated complex signal and a Fourier transform module applied to the demodulated complex signal for generating a demodulated frequency-domain signal.

9. The reflectometry system of claim 8, in which the complex correlator comprises a correlator of the frequency-domain signal generated with the demodulated frequency-domain signal and an inverse Fourier transform applied to the result of the correlation.

10. The reflectometry system as claimed of claim 4, in which the complex signal generator comprises an interface for receiving digital data to be transmitted and a modulator for converting the digital data into complex symbols, said system further comprising a receiver for converting the complex demodulated signal into received digital data.

11. The reflectometry system of claim 10, further comprising an encoder of the digital data to be transmitted and a decoder of the received digital data, the control mechanism being configured for determining the coding rate of the encoder and of the decoder.

12. The reflectometry system of claim 11, further comprising a module for calculating the error rate between the decoded digital data and the digital data to be transmitted, the control mechanism being configured for determining the value of the transposition frequency of the signal and/or the coding rate as a function of at least the calculated error rate.

* * * * *